(12) United States Patent
Finders

(10) Patent No.: US 7,811,746 B2
(45) Date of Patent: Oct. 12, 2010

(54) METHOD OF PATTERNING A POSITIVE TONE RESIST LAYER OVERLAYING A LITHOGRAPHIC SUBSTRATE

(75) Inventor: Jozef Maria Finders, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 831 days.

(21) Appl. No.: 11/527,732

(22) Filed: Sep. 27, 2006

(65) Prior Publication Data

US 2007/0077526 A1      Apr. 5, 2007

Related U.S. Application Data

(63) Continuation-in-part of application No. 11/243,190, filed on Oct. 5, 2005.

(51) Int. Cl.
*H01L 21/00* (2006.01)
*G03F 1/00* (2006.01)

(52) U.S. Cl. .................. 430/313; 430/314; 430/394; 430/330

(58) Field of Classification Search .................. None
See application file for complete search history.

(56) References Cited

U.S. PATENT DOCUMENTS

| | | | |
|---|---|---|---|
| 6,042,998 A | 3/2000 | Brueck et al. | |
| 6,569,605 B1 | 5/2003 | Bae | 430/316 |
| 2002/0150841 A1 | 10/2002 | Wang et al. | |

OTHER PUBLICATIONS

European Search Report issued for European Patent Application No. 06255143.7-2222, dated Feb. 19, 2007.
Maenhoudt, et al., "Double Patterning Scheme for sub-0.25 k1 Single Damascene Structures at NA=0.75, λ=193nm," Optical Microlithography XVIII, Proceedings of SPIE vol. 5754, 2005, pp. 1508-1518.
Ebihara, et al., "Beyond $K_1$=0.25 Lithography: 70nm L/S Patterning Using KrF Scanners," Proceedings of SPIE vol. 5256, 2003, pp. 985-994.
Fu et al., "Maximization of Process Window for Low-k1 Spaces Using KrF Lithography," Proceedings of SPIE, vol. 5040, 2003, pp. 955-966.
Yan, et al., "Sub-Micron Low-$k_1$ Imaging Characteristics Using a DUV Printing Tool and Binary Masks," Proceedings of SPIE, vol. 2440, pp. 270-277, no Date.
Neisser et al., Simulation and Experimental Evaluation of Double Exposure Techniques, IBM Microelectronics, 372/SPIE vol. 3334, pp. 372-383.
Yen et al., Low-K, Optical Lithography for 100 nm Logic Technology and Beyong, J. Vac. Sci. Technol. B 19(6), Nov./Dec. 2001, pp. 2329-2334.

*Primary Examiner*—Daborah Chacko Davis
(74) *Attorney, Agent, or Firm*—Pillsbury Winthrop Shaw Pittman LLP

(57) ABSTRACT

A single exposure method and a double exposure method for reducing mask error factor and for enhancing lithographic printing-process resolution is presented. The invention comprises decomposing a desired pattern of dense lines and spaces in two sub patterns of semi-dense spaces that are printed in interlaced position with respect to each other, using positive tone resist. Each of the exposures is executed after applying a relative space-width widening to the spaces of two corresponding patterning device patterns of semi-dense spaces. A factor representative for the space-width widening has a value between 1 and 3, thereby reducing mask error factor and line edge roughness.

25 Claims, 7 Drawing Sheets

METHOD OF PATTERNING A POSITIVE TONE RESIST LAYER OVERLAYING A LITHOGRAPHIC SUBSTRATE

This application is a continuation-in-part application of co-pending U.S. patent application Ser. No. 11/243,190, filed Oct. 5, 2005, the entire contents of which is hereby incorporated by reference.

FIELD

The invention generally relates to photolithography and associated methods for exposing semiconductor substrates.

BACKGROUND

Lithographic exposure apparatuses can be used, for example, in the manufacture of integrated circuits (ICs). In such a case, a patterning device (e.g. a mask or reticle provided with a mask pattern) may generate a circuit pattern corresponding to an individual layer of the IC. In photolithography, a beam of radiation is patterned by having that beam traverse the patterning device, and is projected by a projection system of the lithographic apparatus onto a target portion (e.g., comprising one or more dies) on a substrate (silicon wafer) that has been coated with a layer of photo-active resist (i.e., photoresist) material, such as to image a desired pattern in the resist. In general, a single substrate will contain a whole network of adjacent target portions that are successively irradiated via the projection system, one at a time.

In the semiconductor industry, the continual demand for smaller semiconductor devices, having smaller patterns and features on the substrate, is pushing the limits on the optical resolution that can be achieved by a lithographic exposure apparatus.

Generally, the smallest size of a repeatable feature (e.g., "half-pitch") of a pattern exposed on the substrate that can be optically resolved by a lithographic exposure apparatus, depends on attributes of the projection system and the (patterned) projection beam of radiation. In particular, the optical resolution for half-pitch feature size may be derived by using the simplified form of the Rayleigh resolution equation:

$$p_{0.5} = k_1 \cdot \lambda / NA, \text{ with } k_1 \geq 0.25 \quad (1)$$

where $p_{0.5}$ represents the repeatable feature size (e.g., "half-pitch") in nm, NA represents the numerical aperture of projection system, $\lambda$ represents the wavelength of projection beam, in nm; and $k_1$ is a factor representative for the achievable optical resolution limit for the half-pitch feature size.

As indicated above, the theoretical optical resolution half-pitch lower limit for $k_1$ is 0.25. In an attempt to approach the $k_1 = 0.25$ barrier, considerable efforts have been directed to develop expensive technologies that are capable of employing shorter wavelengths and/or higher numerical apertures, thus allowing production of smaller features approaching the $k_1 \geq 0.25$ constraint.

Fabrication of an integrated circuit pattern involves the control of space tolerances between features, as well as control of feature dimension tolerances. In particular the control of tolerances of the smallest dimensions, such as the sizes of contacts or the width of lines or of spaces between lines permitted in the fabrication of the integrated circuit device, is of importance. The size of these most critical dimensions is referred to as the critical dimension ("CD"). Features comprising a minimum size substantially equal to the CD are referred to as "CD-sized features" in the present text.

Further, a variety of phenomena that accompany low k1 imaging, such as line-end retraction, corner rounding, variation of CD versus pitch, mask error factor ("MEF"), and line-edge roughness ("LER") may lead to a loss of feature fidelity beyond tolerance. In particular, MEF contributes to variations in lengths of polysilicon gates, reducing performance of the integrated circuit. The MEF is defined as the ratio of a change in CD of CD-sized features in resist in response to a change of the corresponding size of the corresponding features on the patterning device, wherein the latter size is normalized to substrate level taking into account a demagnification of the projection system. In the field of photolithography, mask error factor is, alternatively, also referred to as mask error enhancement factor ("MEEF"). The two concepts are identical, and in the present text referred to as mask error factor or MEF.

A lithographic apparatus, as mentioned above, typically includes a radiation system and a projection system. The radiation system generally includes an illumination system. The illumination system receives radiation from a source, such as a laser, and produces an illumination beam for illuminating an object, such as the patterning device (e.g., a mask on a mask table). Within a typical illumination system, the beam is shaped and controlled such that at a pupil plane of the illumination system the beam has a desired spatial intensity distribution. Such a spatial intensity distribution at the pupil plane effectively acts as a virtual radiation source for producing the illumination beam. Various shapes of the intensity distribution, consisting of (substantially uniform) light areas on a dark background, can be used. Any such shape will be referred to hereinafter as an "illumination mode". Known illumination modes include: conventional (a top-hat shaped intensity distribution in the pupil), annular, dipole, quadrupole and more complex shaped arrangements of the illumination pupil intensity distribution. A lateral position in the pupil plane corresponds to an angle of incidence at the patterning device, and any such angle of incidence is commonly expressed as a fraction sigma ($\sigma$) of a numerical aperture NA of the projection system. Therefore, a more complete characterization of the intensity distribution in a pupil of the illumination system involves, besides an indication of the illumination mode, also an indication of parameters of the illumination mode, such as, for example, $\sigma$ and NA. A combination of an illumination mode and corresponding parameters of the illumination mode is referred to hereinafter as an "illumination setting". Known illumination settings include: a "conventional" illumination setting (wherein the intensity distribution in an illumination pupil is substantially uniform up to a certain radius defined by a parameter value of $\sigma$, where $0 < \sigma < 1$, and a parameter value of the numerical aperture NA of the projection system), an annular setting, a dipole setting, a quadrupole setting and more complex arrangements. An annular or a multipole setting are typically characterized by the parameters $\sigma_{inner}$ and $\sigma_{outer}$ respectively indicating an inner and outer radial extent of an annulus or of poles. Such illumination modes provide off-axis illumination of a patterning device. Illumination settings may be formed in various ways. The $\sigma$ value of a conventional illumination mode may be controlled using a zoom lens while $\sigma_{inner}$ and $\sigma_{outer}$ values of an annular mode may be controlled using a zoom-axicon. The NA value can be controlled using a settable iris diaphragm in the projection system.

More complex settings (such as including dipole and quadrupole modes) may be formed using a diaphragm with appropriate apertures in the pupil plane or by a diffractive optical element. Typically, the diffractive optical element is arranged to generate a preselected angular intensity distribution upstream of a pupil plane of the illumination system. This angular intensity distribution is transformed into a corresponding spatial intensity distribution in the pupil plane of the illumination system.

In particular at high numerical aperture (NA>0.85) and using off axis illumination modes for illuminating the patterning device, MEF and LER are the most prominent errors limiting a further reduction of $k_1$ for those lithographic processes wherein the task is to print in resist semi-dense regularly spaced patterns of trenches or lines, the width sized at the critical dimension and the features spaced apart about three times the critical dimension.

SUMMARY

One or more embodiments of the invention ameliorate a lithographic exposure process for patterning a resist layer. A method consistent with the principles of the invention, as embodied and broadly described herein, provides for the enhancement of image resolution in a lithographic system.

According to an aspect of the invention, there is provided a method of patterning a resist layer, overlaying at least partially a lithographic substrate, with a target pattern comprising a periodic arrangement of a target feature and an adjacent space, the target feature having a target feature width, comprising:

illuminating a patterning device pattern comprising a periodic arrangement of an object feature and an adjacent space, the object feature having an object feature width;

projecting the patterning device pattern at a demagnification onto the substrate, wherein a ratio, defined as the object feature width multiplied by the demagnification and divided by the target feature width, has a value lower than 0.8;

exposing the resist layer to an image of the patterning device pattern wherein each of the object features is imaged at a brightness lower than the brightness of respective adjacent spaces; and compensating for the ratio being lower than 0.8 to provide the target pattern.

According to an aspect of the invention, there is provided a method as described above wherein the periodic arrangement of the target pattern has a target pitch and wherein a target duty cycle, defined as the target feature width divided by the target pitch, is a value between 0.7 and 0.8.

According to an aspect of the invention, there is provided a method as described above, wherein the periodic arrangement of the patterning device pattern has an object pitch and wherein an object duty cycle, defined as the object feature width divided by the object pitch, is a value between 0.2 and 0.5.

According to an aspect of the invention, there is provided a method of providing a substrate with a desired pattern comprising a periodic arrangement of a desired feature and an adjacent desired space, comprising:

patterning a first resist layer overlaying at least partially the substrate with a first target pattern according to the second method described above, the first target pattern comprising a periodic arrangement of a target feature with the desired space disposed adjacent to the target feature;

developing the first resist layer;

providing to the substrate a second resist layer overlaying at least partially the substrate; and patterning the second resist layer with a second target pattern according to the second method described above, the second target pattern comprising a periodic arrangement of a target feature with the desired space disposed adjacent to the target feature, wherein the patterning the second resist layer is arranged to position the spaces of the second target pattern in interposed relation to the spaces of the first target pattern to form the desired pattern.

According to an aspect of the invention, there is provided a method of providing a substrate with a desired pattern comprising a periodic arrangement of a desired feature and an adjacent desired space, including:

patterning a first resist layer overlaying at least partially the substrate with a first target pattern according to the third method described above, the first target pattern comprising a periodic arrangement of a target feature with the desired space disposed adjacent to the target feature;

developing the first resist layer;

providing to the substrate a second resist layer overlaying at least partially the substrate; and patterning the second resist layer with a second target pattern according to the third method described above, the second target pattern comprising a periodic arrangement of a target feature with the desired space disposed adjacent to the target feature, wherein the patterning the second resist layer is arranged to position the spaces of the second target pattern in interposed relation to the spaces of the first target pattern to form the desired pattern.

According to another aspect of the invention, there is provided a computer program product comprising program code to control a lithographic apparatus to perform a method of patterning a resist layer, overlaying at least partially a substrate, with a target pattern comprising a periodic arrangement of a target feature and an adjacent space, the target feature having a target feature width, the method comprising:

illuminating a patterning device pattern comprising a periodic arrangement of an object feature and an adjacent space, the object feature having an object feature width;

projecting the patterning device pattern at a demagnification onto a substrate;

exposing a resist layer, overlaying at least partially the substrate, to an image of the patterning device pattern wherein each of the object features is imaged at a brightness lower than the brightness of respective adjacent spaces, and compensating for a bias-ratio being lower than 0.8, wherein the bias-ratio is defined as the object feature width multiplied by the demagnification and divided by the target feature width.

According to a further aspect of the invention, there is provided a lithographic apparatus comprising a controller configured to run the computer program product described above and to effect the compensating described therein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

As noted above, there exists a constant need to achieve finer optical resolutions thereby approaching the theoretical half-pitch lower limit $k_1$ of 0.25, for printing patterns of features and spaces between the features, such as, for example, dense or semi-dense patterns of lines and spaces. Besides enhancing the resolution of the lithographic patterning process, there is a need to maintain feature fidelity. The patterning device pattern may be embodied as a chrome on glass pattern substantially similar to the target pattern, i.e., the desired pattern. However, during the manufacturing of a patterning device pattern, for example embodied as a quartz substrate provided with a pattern of features of chromium by means of electron beam writing, residual pattern-writing errors may occur. Such errors are by the lithographic process transferred into the target pattern, and the sensitivity of a lithographic process to such pattern errors is expressed by a so called mask error factor. A reduction of mask error factor would provide an advantage.

As noted above the phenomenon of mask error factor (MEF) accompanying low $k_1$ imaging, may lead to a loss of feature fidelity beyond tolerance. The MEF is defined as the ratio of a change $\Delta RS$ of a CD-sized feature width RS in resist, in response to a change $\Delta PS$ of a corresponding size PS of the corresponding features on the patterning device, wherein the size PS is normalized to substrate level taking into account the demagnification M of the projection system (the magnitude of M may for example be ¼, ⅕ or ⅛):

$$MEF=\Delta RS/(\Delta PS \cdot M) \qquad (2)$$

For simplicity, in the present text and formulas, the scaling factor M is or may not be mentioned, but is assumed to be accounted for when discussing dimensions at patterning device level. In the presence of a mask error factor, the feature fidelity as provided by the imaging process using the projection system in combination with the imaging properties of the exposed resist may become affected such as to become beyond tolerance. Below, in the formulas and Figures, M is set equal to 1 although it is appreciated that the invention is not limited to processes and apparatus wherein M=1.

Figure 8:
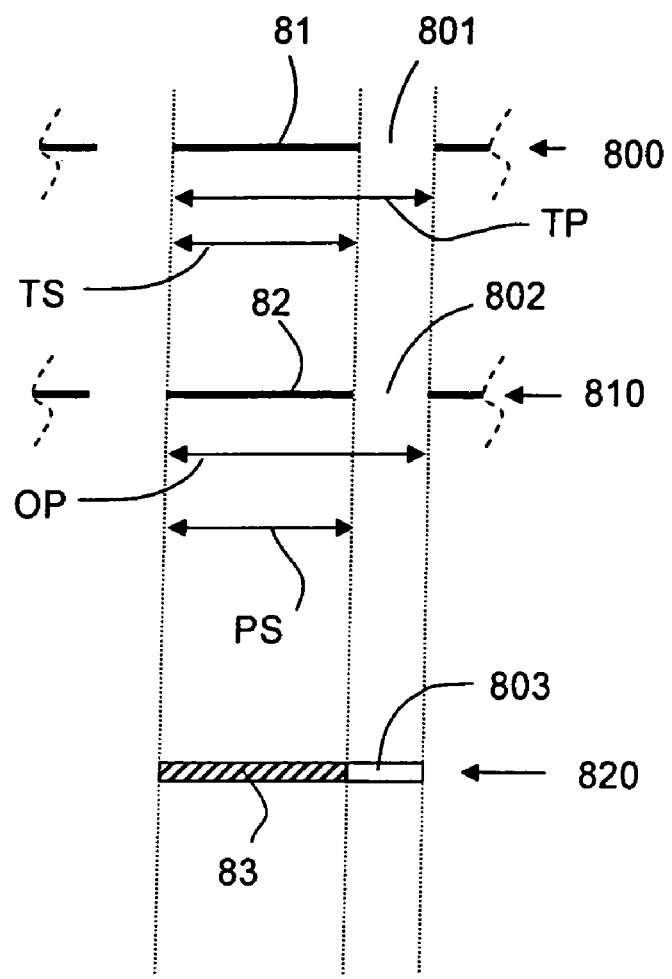
FIG. 8 illustrates sizes of a feature of a target pattern, a patterning device pattern and a resist layer in relation to each other.

To illustrate the occurrence of MEF, a resist patterning process is schematically indicated in FIG. 8. In the process, a target pattern 800, comprising a periodic arrangement of a target feature 81, having a width TS, and an adjacent space 801 (which may, for example, be a line shaped feature 81 and an adjacent space 801) is to be printed in positive tone resist, provided as a layer 820 on a substrate. The pitch of the periodic arrangement is indicated by TP in FIG. 8, and is referred to as the target pitch. A patterning device pattern 810 is illuminated and projected onto the substrate to expose the resist layer 820. The patterning device pattern 810 comprises a periodic arrangement of an object feature 82 and an adjacent space 802, in accordance with the target pattern 800. The object feature 82 has an object feature width PS, and the adjacent space 802 has a width of critical dimension CD of 25 nm. Further, the pitch at which the object feature and the adjacent space occur in the periodic arrangement 810 is referred to as the object pitch OP (hence, the relatively narrow spaces 802 are disposed at a pitch OP). In the present process, the pitch OP is 100 nm. Thus, the object feature 82 has a width of 75 nm, i.e., three times the critical dimension CD. The exposure process may, for example, be executed using an attenuated Phase Shift Mask (att-PSM). With such a mask, the object features are embodied as phase shifting, radiation absorbing features (but passing a small percentage of the radiation), for example of molybdenum silicide (MoSi), with a width of three times the critical dimension CD, i.e., 75 nm, on a quartz substrate. The object feature 82 is imaged as a dark feature in an image of the mask pattern at substrate level, and results in unexposed resist material feature 83, whereas the space 802 is imaged as a bright area in the image, resulting in portion 803 of photoactivated resist.

The periodic arrangement of the target pattern as described here can be further characterized by a target duty cycle TDC defined as target feature width TS divided by target pitch TP, referring to the dimensions of the features in the patterned resist layer, and a patterning device pattern duty cycle PDC, also referred to as an object duty cycle or pattern duty cycle, defined as object feature width PS divided by object pitch OP, referring to the dimensions of the features at patterning device level. For the present process, the duty cycles TDC and PDC are equal: TDC=PDC=75 [nm]/100 [nm]=0.75.

Figure 9:
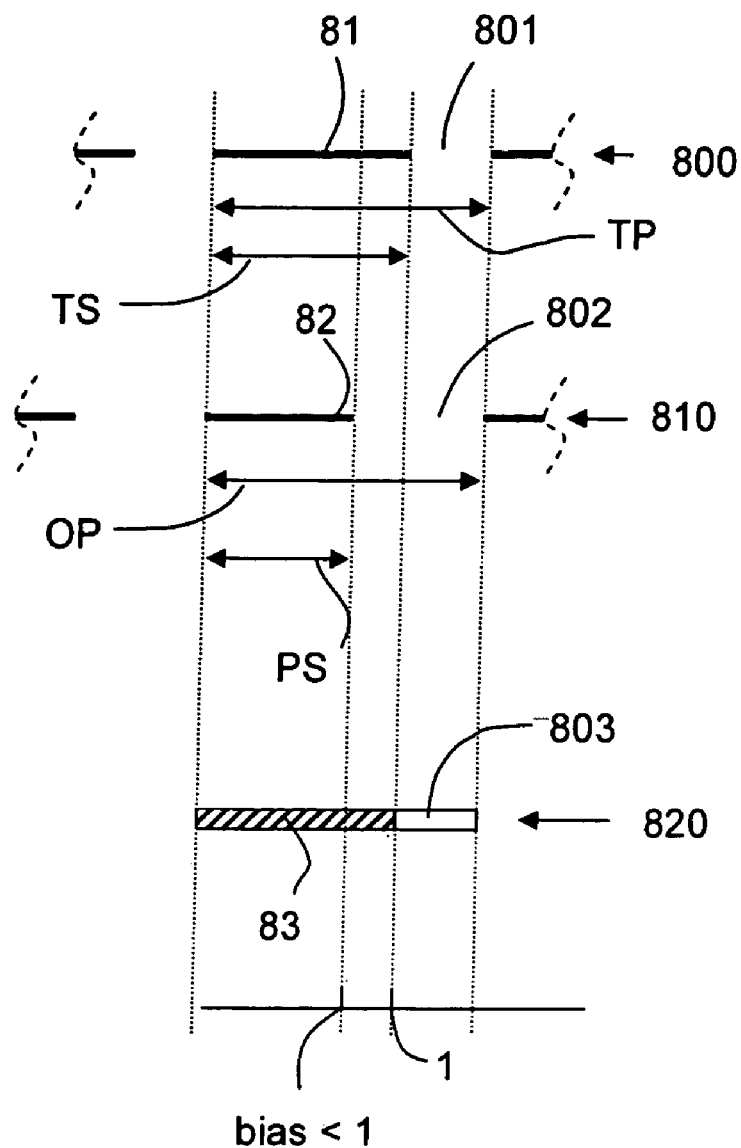
FIG. 9 illustrates sizes of a feature of a target pattern, a patterning device pattern and a resist layer in relation to each other according to an embodiment of the invention.

To further characterize the lithographic patterning process, a parameter BR, referred to as a bias-ratio, or ratio, or also as a bias, is defined as the ratio of the object feature width scaled by the demagnification of the projection system, PS·M to the target feature width TS of the features of the target pattern:

$$BR=PS \cdot M/TS, \qquad (3)$$

and for the present process BR=1 (M=1). FIG. 9 schematically indicates the definition of the ratio BR.

Generally, additional size deviations of patterning device pattern features are introduced to compensate, for example, effects of errors occurring during projection and exposure of a pattern. Such biasing of patterning device pattern features may involves relative size deviations with respect to a nominal size of up to about 10%. Application of a bias results in an object duty cycle PDC which slightly deviates from the target duty cycle TDC. For example, when in the process described above the width of the spaces is increased by a factor 1.2, while the pitch of the spaces is kept at 100 nm, the pattern duty cycle PDC is 0.7 and the bias-ratio BR is 0.93. Generally, deviations from unity of the bias-ratio BR are limited, however, to about + or −0.1.

Figure 1:
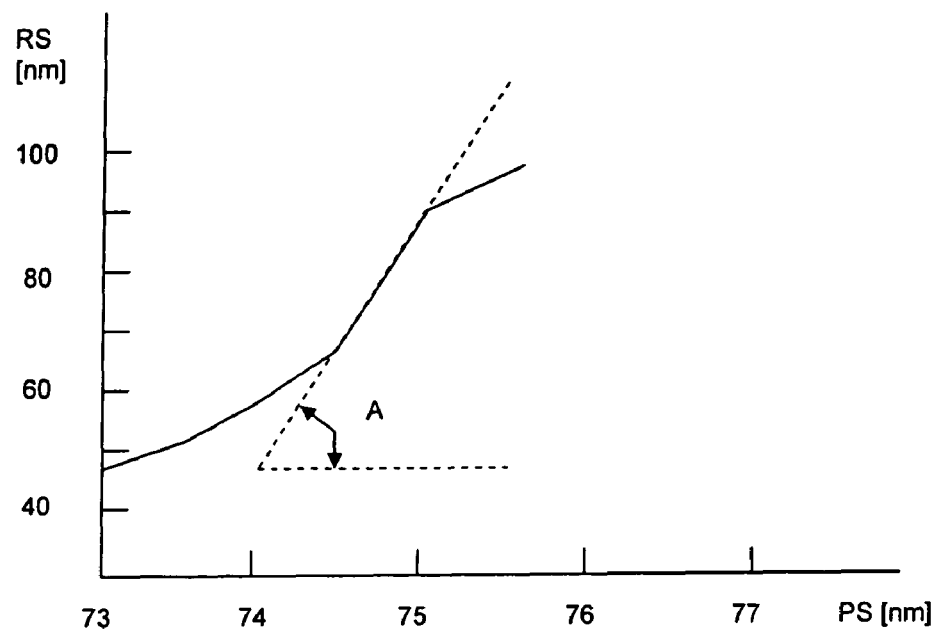
FIG. 1 illustrates a magnitude of mask error factor for a lithographic patterning process, wherein the horizontal axis indicates a width of lines of a patterning device pattern, and the vertical axis indicates a width of lines as patterned in resist.

An example of the magnitude of the MEF, and typical for a process where the target pattern and the patterning device pattern are a periodic line and space pattern with a bias-ratio BR between 0.9 and 1.1, is illustrated in FIG. 1. In FIG. 1, the horizontal axis indicates the width PS of the lines of the patterning device pattern, and the vertical axis indicates the resulting width 83 of the lines as patterned in resist, ideally corresponding to the target width TS. The tangent of the slope-angle A of the plot of the width 83 versus the width PS in FIG. 1 represents the mask error factor for the present lithographic process. The process is further characterized by a positive tone resist model which was calibrated for a NA of 0.93, a resist layer thickness of 50 nm, and a dipole TE polarized illumination mode with $\sigma_{inner}=0.82$ and $\sigma_{outer}=0.96$. The value of MEF varies strongly with the width of the patterning device pattern feature and is of the order of 10.

According to a first embodiment of the invention, the MEF of this process can be substantially reduced by selecting a value of the bias-ratio BR which is lower than 0.8. In this embodiment, the bias-ratio is chosen to be 0.67. This implies that both the lines and the spaces at the patterning device are embodied as lines and spaces of 50 nm width. The object duty cycle PDC is 0.5, and the required target duty cycle TDC is 0.75.

Figure 2:
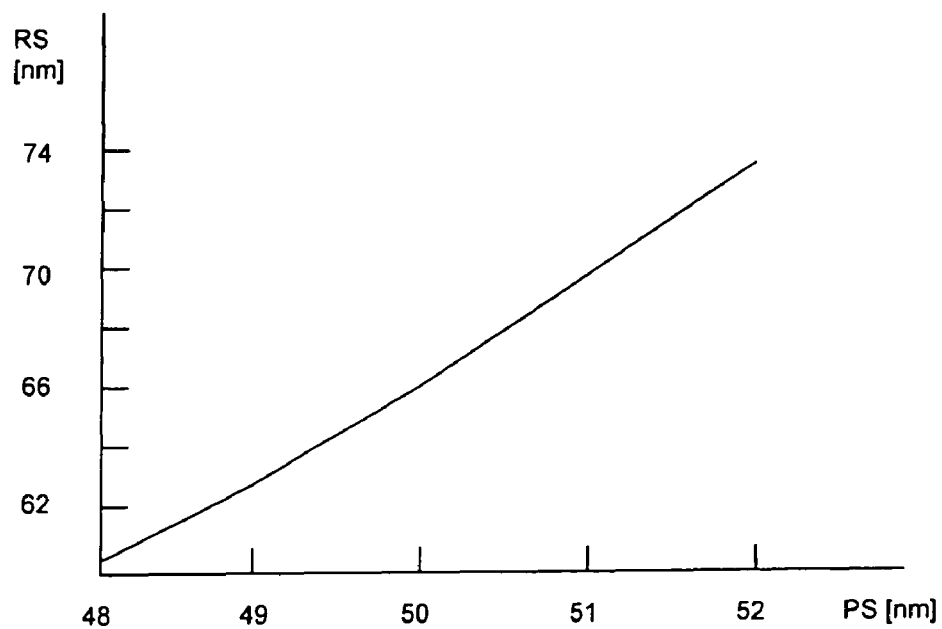
FIG. 2 illustrates a magnitude of mask error factor for a lithographic patterning process according to an embodiment of the invention.

FIG. 2 illustrates the resulting sensitivity to patterning device pattern errors under the same illumination conditions as described above. The MEF is reduced to a value in a range between 2.9 and 3.8. In the schematic illustration in FIG. 9, the bias of the object feature 82 is applied asymmetrically with respect to the position of the target feature. It is appreciated that the invention is not limited to such an asymmetric bias, but that the bias can be disposed differently and in particular the bias can be arranged symmetric with respect to the corresponding target feature.

In this embodiment, the required target duty cycle TDC=0.75 is obtained by compensating the patterning process for the applied bias of 0.67. The compensating includes adjusting the exposure dose to compensate for the pattern duty cycle PDC being set at 0.5 instead of 0.75. Such an adjustment of exposure dose causes an adjustment of the exposure dose within exposed areas of the pattern of the radiation at substrate level. For analysis purposes, this pattern can be considered as an aerial image as provided by the projection system. In this embodiment, the contrast of the aerial image is much larger than the contrast of the aerial image in the conventional process, described above, wherein TDC=0.75 and 0.9<BR<1.1. Therefore, a lowering of exposure dose with respect to the exposure dose in the prior art process can be exploited to broaden areas of the aerial image wherein exposure dose is below energy-to-clear. Here, the concept of "energy-to-clear" is related to a change of solubility from insoluble to soluble in a positive tone resist (and from soluble to insoluble in a negative tone resist) which occurs at a threshold value of the exposure dose, the so-called energy-to-clear. The reduction of MEF as obtained also leads to a reduction of LER, since a line edge roughness error in the processed target pattern is dependent on a line edge roughness of the features comprised in the patterning device pattern.

Another embodiment is the same as the first embodiment, except that the target duty cycle TDC differs from 0.75. An advantage of the method as described above is substantially the same for semi-dense target patterns of spaces adjacent to non-critically sized features. In this embodiment, the features of the target pattern have a width in the range of 70 nm to 80 nm, and the target pitch of the features and spaces is 100 nm. Thus, the value of target duty cycle TDC may be selected from a range of values 0.7 to 0.8. This range of target pattern feature widths may be provided using patterning device pattern feature widths in the range of 20 nm to 55 nm at a pitch of 100 nm (ignoring the scale factor M) in combination with an adjustment of the exposure dose to maintain any of the selected target pattern duty cycles, i.e., with the pattern duty cycle PDC having a value in the range 0.2 to 0.55. With pattern feature widths in the range of 20 nm to 55 nm at a pitch of 100 nm, the bias-ratio BR has, in this embodiment, a lowest value of 0.25 and a highest value of 0.78, i.e., below 0.8.

The concept of a "space" in a pattern of features and spaces in resist is not limited to a space as obtained after development of the resist. One or more advantages of the invention is obtained irrespective of lithographic processing after exposure, such as a post exposure bake and a development of the resist.

In another embodiment, which is the same as either of the embodiments described above, the features of the target pattern are features of unexposed positive tone resist material, and the spaces of the target pattern are embodied as portions of photo activated positive tone resist material, where these portions are shaped in accordance with the spaces of the target pattern.

A further reduction of MEF may be achieved in another embodiment, which is the same as the first embodiment above except that the pattern duty cycle PDC=0.25 (pattern features of 25 nm and pattern spaces of 75 nm) and the target duty cycle TDC=0.5 (target pattern features of 50 nm width and target pattern spaces of 50 nm width). The bias-ratio BR is 0.5, and the obtainable MEF is 2.

According to an aspect of the invention, a negative tone resist (instead of a positive tone resist) may be used in any of embodiments described above, when instead of the spaces in these embodiments corresponding features of exposed negative tone resist material (and protruding from a surface of the substrate after development of the unexposed resist) have to be provided. Since then the imaging of the patterning device pattern is substantially the same as in the above described embodiments, a similar reduction of MEF is obtained.

According to another aspect of the invention, the compensating for the applied bias in any of the above described embodiments includes developing (dissolving) of exposed resist and applying a feature shrink process, or a combination of exposure dose adjustment and applying a feature shrink after development. The feature shrink process may be arranged to reduce the width of the spaces of the pattern obtained upon resist development. For example, the shrinking of the spaces may be provided by applying a chemical processing (such as overcoating the spaces with RELACS™ material, applying a mixing/bake process, cooling the substrate and rinsing using de-ionized water) or by a thermal resist flow processing for shrinking features, which may enable feature size correction of an up to 50 nm shrink in a controlled way.

As noted above, there exists a constant need to achieve finer optical resolutions. It is possible to circumvent the theoretical half-pitch lower limit $k_1$ of 0.25 for printing dense features by using a double exposure process and exploiting the advantages of the single exposure embodiments described above.

As described in greater detail below, an embodiment of the invention achieves resolutions lower than the half-pitch lower limit $p_{0.5}=k_1 \cdot \lambda/NA$ wherein $k_1=0.25$, thus circumventing the $k_1=0.25$ barrier, by implementing a dual exposure technique wherein between the two exposures a post exposure bake (also referred to as "PEB") of the resist is applied, or alternatively, a post exposure-bake in combination with a subsequent development of the resist is applied. A resist pattern obtained after developing the resist may serve as an etch mask for etching a hard mask disposed underneath the resist layer.

According to an aspect of the invention, the lithographic dual exposure patterning process involves the use of positive tone resist for printing features wherein $k_1<0.25$. The use of positive tone resist is desirable over the use of negative tone resist for lithographic printing of features such as, for example, dense, semi-dense and/or isolated lines.

According to an aspect of the invention, the method of patterning a resist layer as described in any of the embodiments described above may be applied twice in a double exposure lithographic process. According to an embodiment, a desired pattern of dense CD-sized features and CD-sized spaces (such as for example, dense lines and spaces) is decomposed into first and second target patterns of semi-dense, CD-sized spaces (and non-critically sized features). The spaces are printed in interposed or interlaced position with respect to each other, using positive tone resist for each exposure. Two patterning device patterns, or object patterns are associated with the two respective target patterns, and the respective object patterns may be disposed on a single reticle or on two separate reticles. In the absence of any feature biasing, the features of each object pattern would have a width of about 3 times the critical dimension CD, whereas a space adjacent to such a non-critical feature remains CD-sized. Thus, the target duty cycle TDC would be equal to or about 0.75. However, each of the exposures is preceded by applying a bias-ratio BR to the object features of the two object patterns to a value lower than 0.8, so that the duty cycle PDC of the two object patterns is lower than 0.6. This means that CD-sized spaces of the target patterns correspond to relative space-width widened spaces of the two corresponding patterning device patterns of semi-dense spaces, wherein a factor representative for the space-width widening has a value between 1 and 3 (ignoring the demagnification factor of a projection system), thereby reducing mask error factor and line edge roughness. This aspect will be described in more detail below.

Figure 3:
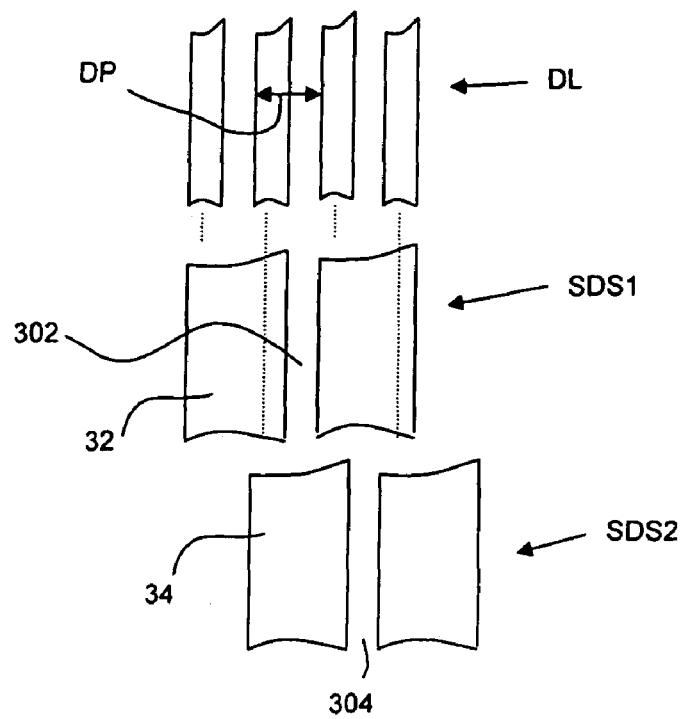
FIG. 3 illustrates a decomposition of a desired pattern of dense features and spaces into two patterns of semi-dense spaces.

According to an embodiment of the invention, there is provided a double exposure method of patterning a material layer, at least partially overlaying a lithographic substrate, with a desired dense pattern DL of features and spaces, as schematically indicated in FIG. 3. FIG. 3 illustrates a periodic arrangement of a desired feature (a line) 31 and an adjacent, desired space 301; the pitch DP of the periodic arrangement is the desired pitch of the pattern DL. The desired pattern DL is split into two, interposed target patterns, respectively a first target pattern SDS1 and a second target pattern SDS2. For the splitting of the desired pattern, rule based or model based patterning device pattern design software may be used. Each of the target patterns SDS1 and SDS2 includes a periodic arrangement of a respective target feature 32, 34 and a respective target space 302, 304 adjacent to the target feature. The width of the target space (302, 304) is identical to the width of the desired space 301, as illustrated in FIG. 3. The method comprises two successive positive tone resist layer patternings, wherein the spaces 302 and 304 of the respective target patterns SDS1 and SDS2, are exposed in interlaced position with respect to each other on the substrate. The patterns SDS1 and SDS2 may be transferred to the material layer to provide the desired pattern DL.

Figure 4:
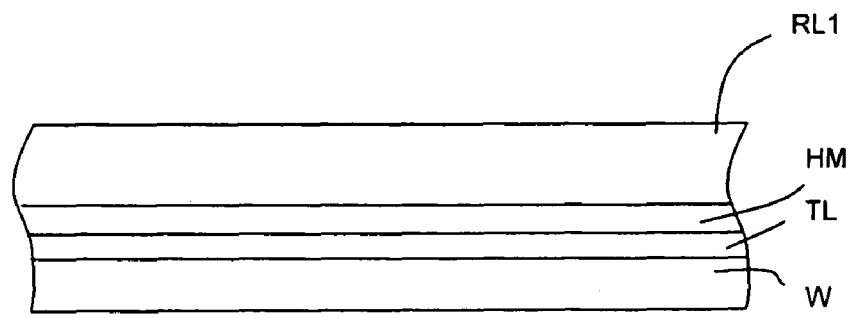
FIG. 4 illustrates a lithographic substrate provided with a hard mask and a resist layer.

In this embodiment, and as illustrated in FIG. 4, the substrate W, which may carry previously processed IC layers, is provided with a target layer TL, a hard mask layer HM on top of the target layer TL, and a positive tone resist layer RL1 on top of the hard mask layer HM.

The first patterning with a target pattern SDS1 having a target duty cycle TDC1, includes providing a patterning device pattern MP1 in accordance with the target pattern SDS1, and having an object duty cycle PDC1, and a bias-ratio BR1. To exploit the advantage of low MEF, the bias-ratio BR1 is chosen to be lower than 0.8.

In this embodiment, the successive exposure conditions are the same as in the first embodiment. For example, the target duty cycles TDC1 and TDC2 of the respective target patterns SDS1 and SDS2 are both 0.75, the object duty cycles PDC1 and PDC2 of the respective patterning device patterns MP1 and MP2 are both 0.5, and the respective bias-ratios BR1 and BR2 for the features of both patterning devices is 0.67.

Figure 5A:
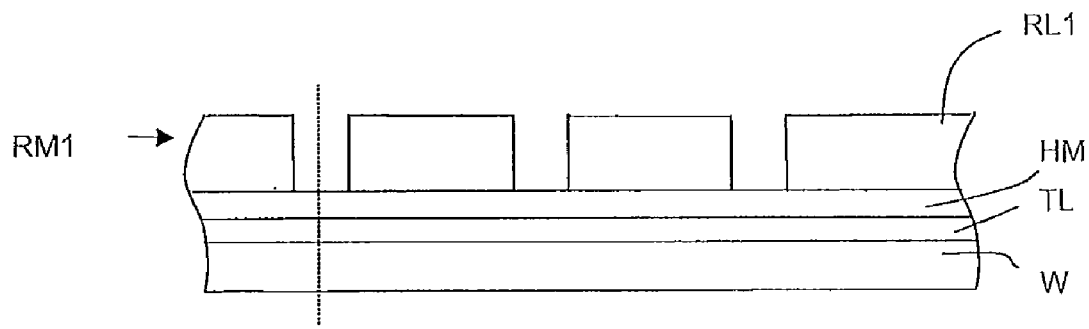
FIG. 5 illustrates consecutive results of a double exposure patterning method according to an embodiment of the invention including the effect of the first exposure and a first etching of the hard mask.
Figure 5B:
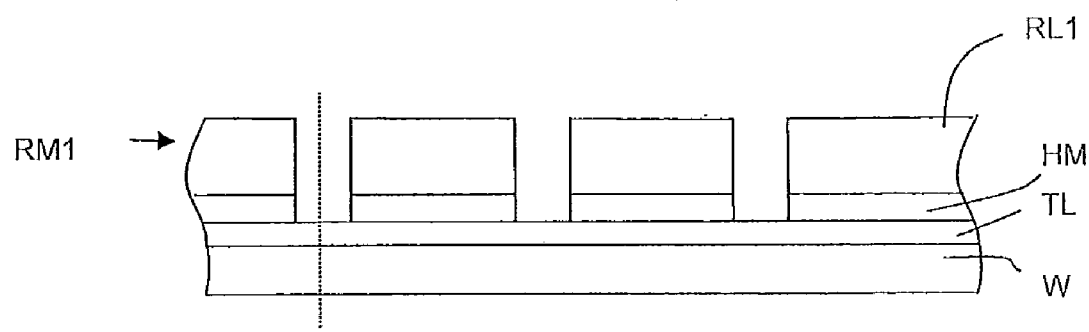
Figure 5C:
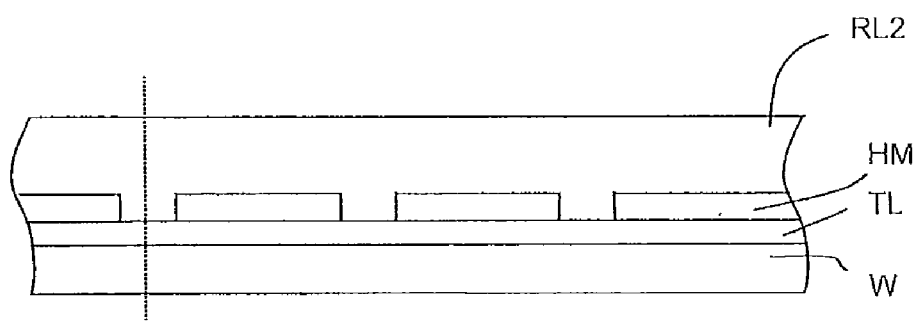

The resist layer RL1 is exposed to a pattern of radiation using the patterning device pattern MP1 and the projection system, which is arranged to image the patterning device pattern onto the resist layer. The exposure dose is adjusted to arrive at the target duty cycle TDC1 as specified for the pattern SDS1. The first patterning is followed by developing the resist layer RL1 to provide an etch mask RM1 of resist material, as illustrated in FIG. 5A. Next the hard mask layer HM is dry etched to transfer the target pattern to the hard mask layer, as illustrated in FIG. 5B. The resist mask RM1 is stripped, and a supplementary positive tone resist layer RL2 is applied to the hard mask layer HM, as illustrated in FIG. 5C.

Figure 5D:
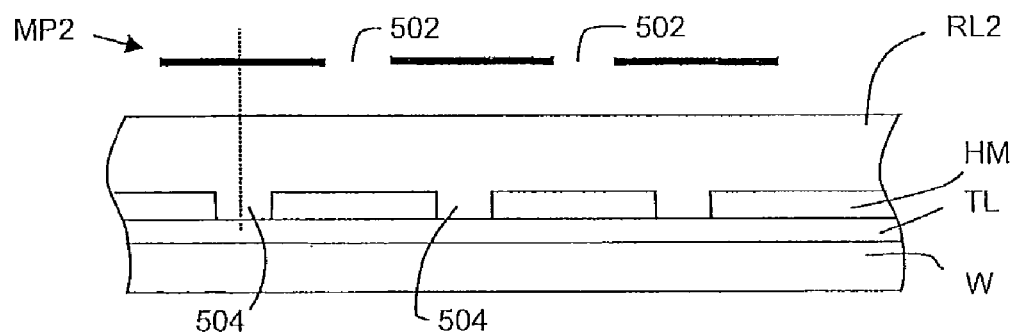

Then, the second exposure is executed the same way as described above, wherein the patterning device MP2 is positioned such that the spaces 304 of the target pattern SDS2 will be disposed in interlaced position with respect to the spaces of the pattern SDS1. This can be realized by arranging the spaces 502 of the patterning device MP2 in interlaced position with respect to the spaces 504 of the previously etched hard mask HM, as illustrated in FIG. 5D.

As with the first exposure, the advantage of low MEF is obtained by the choice of a bias-ratio BR2 lower than 0.8, and by arranging the exposure dose in accordance with the selected bias-ratio BR2 to obtain the target duty cycle TDC2 as specified for the pattern SDS2.

Figure 6A:
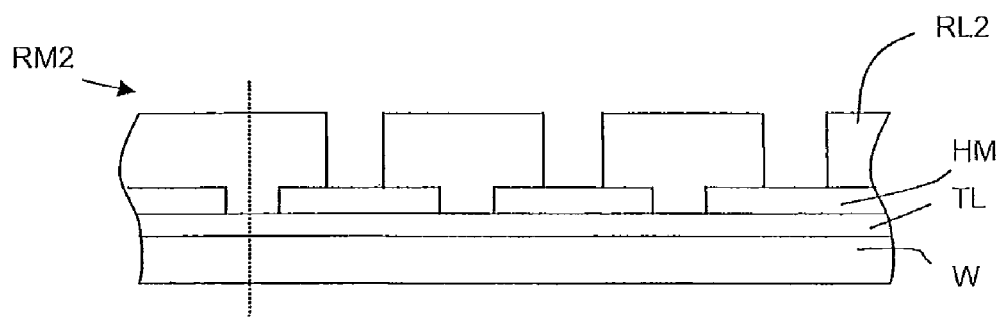
FIG. 6 illustrates the results of a double exposure patterning method according to an embodiment of the invention including the effect of the second exposure and a second etching of the hard mask.
Figure 6B:
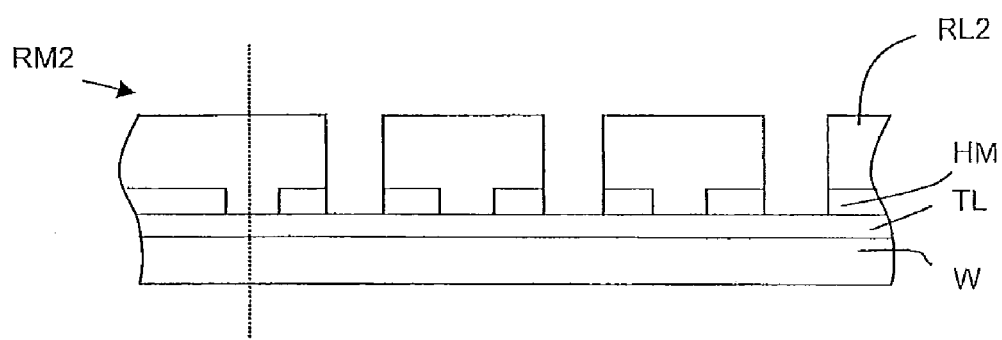
Figure 6C:
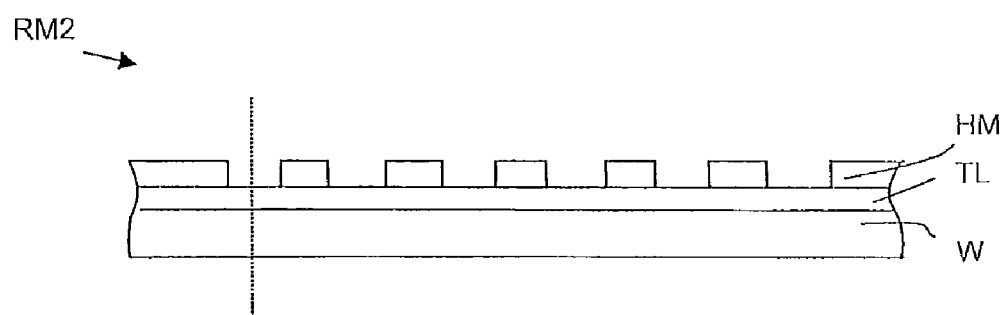

A subsequent development of the exposed resist layer RL2 provides an etch mask RM2 of resist material, as illustrated in FIG. 6A. Next the hard mask layer HM is again dry etched to transfer the target pattern SDS2 to the hard mask layer, as illustrated in FIG. 6B. The resist mask RM2 is then stripped and, as a result a transfer of the target pattern SDS1 and the supplementary target pattern SDS2, a patterning of the hard mask HM which corresponds to the desired pattern DL is obtained, as illustrated in FIG. 6C.

A final pattern transfer which can be part of the previous pattern transfer in an integrated etch chamber, is obtained by applying a third etching of the target layer TL.

In this embodiment, providing the resist masks RM1 and RM2 may further include a variety of processes before and/or after exposure of the resist layer. For example, pre-exposure processes may include cleaning, priming, and soft bake processes. After exposure, the substrate may be subjected to different post-exposure processes, such as, for example, a post exposure bake (PEB), and a hard bake. Further, any photoresist layer may include a bottom anti reflection coating or a developable bottom anti reflection coating to reduce back reflection of exposure radiation.

Another embodiment is the same as the double exposure embodiment just described except for the developing of the resist layer RL1 after the first exposure, and the subsequent etching of the hard mask layer HM and stripping of the resist mask RM1. Instead, after the first exposure and before the second exposure, the resist layer RL1 is subjected to a post exposure bake and next the (substantially) unexposed portions of the resist layer RL1 are subjected to a supplementary, second exposure in accordance with the second exposure process of the previous embodiment. The post exposure bake has the effect of fixing the first target pattern SDS1 in the resist layer RL1, so that during the second exposure the resist has no "memory" of the first exposure. Non-linear chemical properties of the resist are exploited for the fixing the pattern. Typically, positive tone resists for use with KrF excimer lasers and ArF excimer lasers are chemically amplified resists. A critical component of chemically amplified resist materials is the photo-acid generator (referred to as PAG), which is the photo-active ingredient. The resist further comprises a base B compound in a blocked matrix configuration. In this configuration, after exposure, photo-acid generator PAG is converted into a photo-acid PA+, of which some is neutralized by the base B compound.

During the baking process, a reaction is catalyzed between the photo-acid PA+ and the polymer so that, after baking, the polymer is deblocked, rendering it soluble in typical developer solutions, and the photo-acid PA+ is largely dissipated. For example, the photo-induced polymer deblocking reaction may cease, i.e. loses memory of the initial exposure, after approximately 40 seconds of baking time. Then, the chemical reactions occurring between the photo-acid PA+ and the polymer are reduced such that the extent of polymer deblocking does not increase with longer baking times. Thus, for this case, after a 40 second baking interval, the photo-acid PA+ virtually dissipates to provide a relatively high contrast and stable latent image corresponding to the pattern SDS1 in a photoresist that further has little memory of the first (or any other any preceding) exposure.

Due to any non-linearity of the response of a photoresist layer to either development and/or exposure, the spatial Fourier transformation of the features of the resist mask RM1 corresponding to the pattern SDS1, contain higher spatial frequencies than the spatial Fourier transformation of the intensity pattern of the image of the patterning device pattern MP1, as provided by the projection system of the lithographic apparatus. Similarly, the intensity pattern of the image of the patterning device pattern MP2 contain lower spatial frequencies than the spatial Fourier transformation of the features of patterning device pattern MP1. Further, a cross talk or a merging of the two sub-pattern images corresponding to the patterns SDS1 and SDS2 is prevented, in the above described double exposure embodiments, by either a transfer of the pattern SDS1 to the hard mask HM or by fixing the pattern SDS1 in the resist layer. Therefore, also the spatial Fourier transformation of the combined pattern DL as transferred to the hard mask HM contains spatial frequencies higher than corresponding to the inverse of a half pitch $p_{0.5}=k_1 \cdot \lambda/NA$ wherein the limitation $k_1 \geq 0.25$ is valid. The presence of the higher frequencies in principle enables the circumvention of the $k_1=0.25$ barrier.

According to an aspect of the invention, the double exposure embodiments are not limited to the specific values chosen for the target duty cycles and the patterning device pattern or object duty cycles. For example, in analogy with the single exposure processes described earlier, target duty cycles may have a value between 0.7 and 0.8, and pattern duty cycles may have a value between 0.2 and 0.55.

According to an aspect of the invention, any of the embodiments described above is not limited to patterns comprising lines and spaces. The invention is generally applicable to printing features such as trenches arranged in semi-dense patterns (using single exposure processes according to an embodiment of the invention) and dense patterns of trenches (using a double exposure process according to an embodiment of the invention).

Another embodiment is the same as the embodiment just described except for the details described below. According to this embodiment, a double exposure printing method uses two exposures as described above, wherein a further reduction of MEF down to a value of 2 is provided with each exposure. Thus, for the two exposures the respective object duty cycles PDC1 and PDC2 are given by PDC1=PDC2=0.25 (pattern features of 25 nm and pattern spaces of 75 nm) and the respective target duty cycles TDC1 and TDC2 are given by TDC1=TDC2=0.5 (target pattern features of 50 nm width and target pattern spaces of 50 nm with), so that BR1=BR2=0.5.

Further, the etching step between the two exposures and the etching step after the second exposure are each supplemented by applying a feature shrink process. The feature shrink step is arranged to reduce the width of the spaces of the patterns SDS1 and SDS2 for example, down to 30 nm, enabling the interlaced positioning of the spaces, as described above. For example, a feature shrink can be arranged and obtained by applying an etch bias to a process of dry etching the hard mask layer HM. Alternatively, the shrinking is provided by applying a resist-processing to shrink the features of the resist masks RM1 and RM2. Resist process shrink techniques such as a chemical and a thermal resist processing for shrinking features can be used and may enable feature size correction of an up to 50 nm shrink in a controlled way.

According an embodiment of the invention, a deposition of a hard mask layer between the two exposures is not needed. Instead, the present exposure and feature printing method in principle only uses a conventional aqueous development steps and dry etch steps. Consequently, the present method can easily be implemented in a lithographic system comprising the lithographic apparatus and a coat/develop track that is typically linked to the lithographic apparatus.

Figure 7:
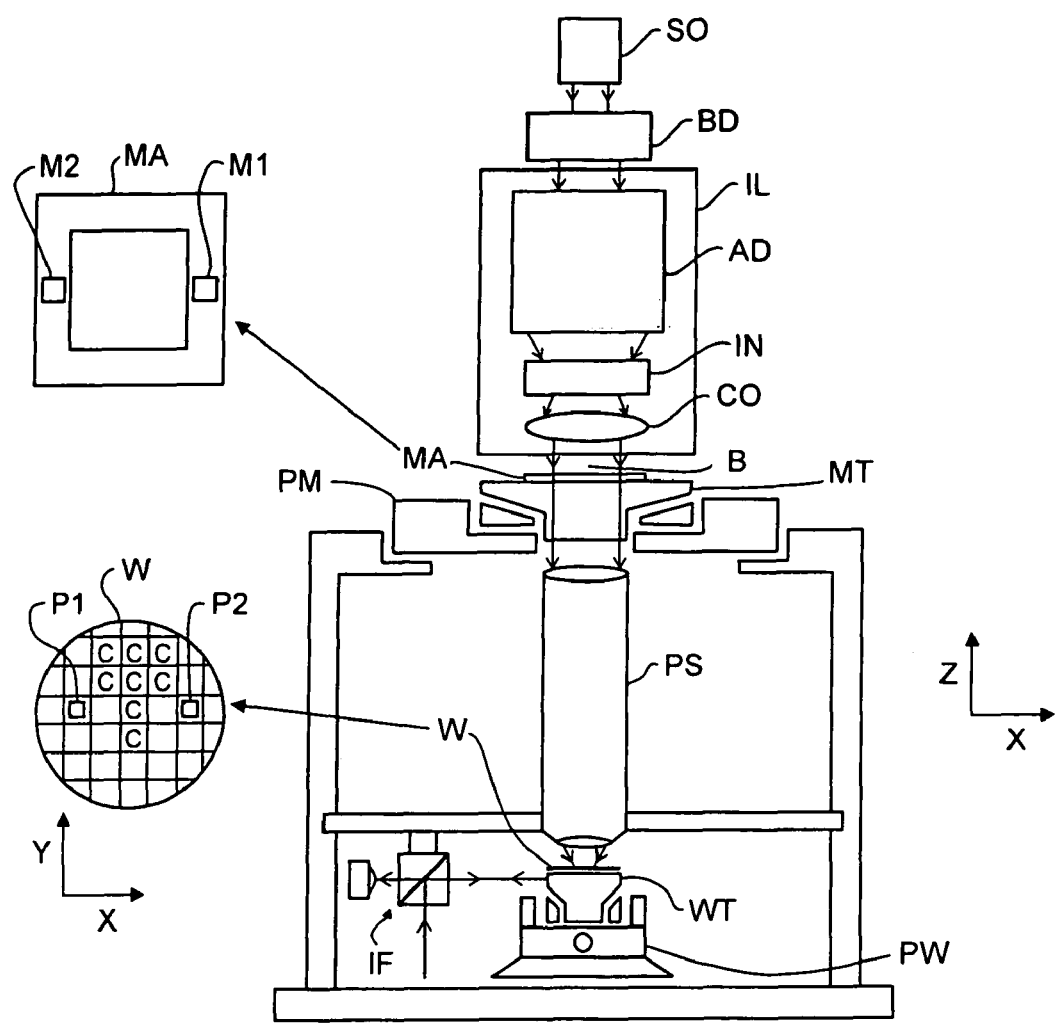
FIG. 7 illustrates a lithographic apparatus according to an embodiment of the invention.

A lithographic exposure apparatus according to an embodiment of the invention is schematically depicted in FIG. 7. The apparatus comprises:

an illumination system (illuminator) IL configured to condition a radiation beam B (e.g., UV radiation or DUV radiation such as for example generated by an excimer laser operating at a wavelength of 193 nm or 157 nm, or EUV radiation generated by a laser-fired plasma source operating at 13.6 nm);

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a-radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit. The patterning device may be transmissive or reflective.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a reflective mask).

The lithographic apparatus may be of a type having two (dual stage) or more substrate tables (and/or two or more support structures). In such "multiple stage" machines the additional tables (and/or support structures) may be used in parallel, or preparatory steps may be carried out on one or more tables (and/or support structures) while one or more other tables (and/or support structures) are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 7, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the parameters σ-outer and σ-inner, respectively, of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 7) can be used to accurately position the patterning device MA with respect to the path of the radiation beam B, e.g., after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field-limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

According to an aspect of the invention, the lithographic system comprises, as the lithographic exposure apparatus, a lithographic interferometric apparatus. In such an apparatus, a resist layer is exposed to a fringe pattern obtained in a multiple beam interferometric apparatus. For example, two collimated beams of UV or DUV radiation intersect each other at an angle to produce linear interference fringes. A substrate having a photosensitive layer is positioned on a movable table. The table is arranged to be rotated and translated in two-dimensions respectively. Two substantially collimated coherent optical beams provided by any suitable well known source or sources are directed at a variable angle from the normal vector associated with the substrate toward each other and toward the photoresist layer to form an interference pattern on the photosensitive layer. The interfering radiation beams of coherent radiation may be generated by, for example, an ArF excimer laser using a beam splitting element, and may be provided in any suitable well known manner so that they are from the same source and are essentially equal in intensity at the substrate which assures a high contrast exposure.

The interference pattern produced on the photoresist layer or layers may be varied by, for example, rotating the substrate and/or translating the substrate.

A control device according to the invention may comprise a memory into which data can be stored which concern the sub-patterns SDS1 and SDS2 and which are used to control the lithographic exposure apparatus (such as, for example, settings concerning positioning of the stages MT and WT, and/or settings concerning illumination modes) during each of the two exposures required to generate the combined pattern DL. The same memory can be used to store data concerning the bias-ratios BR1 and BR2. A computer which may be part of the control device is programmed and arranged to execute, based on the data stored in the memory, any of the method steps according to one or more of the embodiments of the invention.

A computer program product according to an embodiment of the invention may comprise program code to control a lithographic apparatus to perform a method of patterning a resist layer, overlaying at least partially a substrate, with a target pattern comprising a periodic arrangement of a target feature and an adjacent space, the target feature having a target feature width. The method includes illuminating a patterning device pattern comprising a periodic arrangement of an object feature and an adjacent space, the object feature having an object feature width, projecting the patterning device pattern at a demagnification onto a substrate, exposing a resist layer, overlaying at least partially the substrate, to an image of the patterning device pattern wherein each of the object features is imaged at a brightness lower than the brightness of respective adjacent spaces, and compensating for a bias-ratio being lower than 0.8, wherein the bias-ratio is defined as the object feature width multiplied by the demagnification and divided by the target feature width. In an embodiment of the invention, a lithographic apparatus comprises a controller configured to run the computer program product and to effect the compensating. According to an aspect of the invention, the lithographic apparatus is configured to execute a dual exposure process such as described above. The above described controller of the lithographic apparatus is then configured to run the computer program product described above and to effect the compensating for two different resist patterning processes wherein a first resist layer is patterned with a first target pattern including a periodic arrangement of a target feature and an adjacent space and a second resist layer is patterned with a second target pattern including a periodic arrangement of a target feature and an adjacent space, and wherein the spaces of the first and second target patterns are interposed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms. "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A method of patterning a resist layer, overlaying at least partially a lithographic substrate, with a target pattern comprising a periodic arrangement of a target feature and an adjacent space to the target feature, the target feature having a target feature width, comprising:

illuminating a patterning device pattern comprising a periodic arrangement of an object feature and an adjacent space to the object feature, the object feature having an object feature width and the periodic arrangement yielding a plurality of object features and a plurality of respective adjacent spaces to the object features;

projecting the patterning device pattern at a demagnification onto the substrate, wherein a ratio, defined as the object feature width multiplied by the demagnification and divided by the target feature width, has a value lower than 0.8;

exposing the resist layer to an image of the patterning device pattern wherein each of the object features is imaged at a brightness lower than the brightness of respective adjacent spaces to the object features; and compensating for the ratio being lower than 0.8 to provide the target pattern.

2. The method according to claim 1, wherein the periodic arrangement of the target pattern has a target pitch and wherein a target duty cycle, defined as the target feature width divided by the target pitch, is a value between 0.7 and 0.8.

3. The method according to claim 2, wherein the periodic arrangement of the patterning device pattern has an object pitch and wherein an object duty cycle, defined as the object feature width divided by the object pitch, is a value between 0.2 and 0.5.

4. A method of providing a substrate with a desired pattern comprising a periodic arrangement of a desired feature and an adjacent desired space to the desired feature, including:

patterning a first resist layer overlaying at least partially the substrate with a first target pattern according to the method of claim 3, the first target pattern comprising a periodic arrangement of a target feature with a desired space disposed adjacent to the target feature, the periodic arrangement of the first target pattern yielding a plurality of target features of the first target pattern and a plurality of spaces of the first target pattern disposed adjacent to the target features of the first target pattern;

developing the first resist layer;

providing to the substrate a second resist layer overlaying at least partially the substrate; and patterning the second resist layer with a second target pattern according to the method of claim 3, the second target pattern comprising a periodic arrangement of a target feature with a desired space disposed adjacent to the target feature, the periodic arrangement of the second target pattern yielding a plurality of target features of the second target pattern and a plurality of spaces of the second target pattern disposed adjacent to the target features of the second target pattern, wherein the patterning the second resist layer is arranged to position the spaces of the second target pattern in interposed relation to the spaces of the first target pattern to form the desired pattern.

5. The method according to claim 4, wherein the target feature of the first and second target patterns is a resist material feature and the adjacent space to the target feature of the first and second target patterns is a photo-activated portion of resist material.

6. The method according to claim 4, wherein the first and second resists layers comprise a positive tone resist.

7. The method according to claim 6, further including, after developing the first resist layer, etching a hard mask layer underneath the first resist layer to transfer the first target pattern to the hard mask layer, and after patterning the second resist layer, developing the second resist layer and etching the hard mask layer to transfer the second target pattern to the hard mask layer.

8. The method according to claim 6, wherein the compensating as part of the patterning of the first resist layer or of the second resist layer or of the first and second resist layers includes developing exposed resist and applying a feature shrink process.

9. The method according to claim 4, wherein the desired feature is a line shaped feature.

10. The method according to claim 4, wherein the compensating as part of the patterning of the first resist layer or of the second resist layer or of the first and second resist layers includes arranging an exposure dose in accordance with the ratio to provide the target duty cycle.

11. The method according to claim 4, further comprising splitting the desired pattern into two interposed target patterns, respectively the first target pattern and the second target pattern.

12. A method of providing a substrate with a desired pattern comprising a periodic arrangement of a desired feature and an adjacent desired space to the desired feature, comprising:

patterning a first resist layer overlaying at least partially the substrate with a first target pattern according to the method of claim 2, the first target pattern comprising a periodic arrangement of a target feature with a desired space disposed adjacent to the target feature, the periodic arrangement of the first target pattern yielding a plurality of target features of the first target pattern and a plurality of spaces of the first target pattern disposed adjacent to the target features of the first target pattern;

developing the first resist layer;

providing to the substrate a second resist layer overlaying at least partially the substrate; and patterning the second resist layer with a second target pattern according to the method of claim 2, the second target pattern comprising a periodic arrangement of a target feature with a desired space disposed adjacent to the target feature, the periodic arrangement of the second target pattern yielding a plurality of target features of the second target pattern and a plurality of spaces of the second target pattern disposed adjacent to the target features of the second target pattern, wherein the patterning the second resist layer is arranged to position the spaces of the second target pattern in interposed relation to the spaces of the first target pattern to form the desired pattern.

13. The method according to claim 12, wherein the target feature of the first and second target patterns is a resist material feature and the adjacent space to the target feature of the first and second target patterns is a photo-activated portion of resist material.

14. The method according to claim 12, wherein the first and second resist layers comprise positive tone resist.

15. The method according to claim 14, further comprising, after developing the first resist layer, etching a hard mask layer underneath the first resist layer to transfer the first target pattern to the hard mask layer, and after patterning the second resist layer, developing the second resist layer and etching the hard mask layer to transfer the second target pattern to the hard mask layer.

16. The method according to claim 14, wherein the compensating as part of the patterning of the first resist layer or of the second resist layer or of the first and second resist layers includes developing exposed resist and applying a feature shrink process.

17. The method according to claim 12, wherein the desired feature is a line shaped feature.

18. The method according to claim 12, wherein the compensating as part of the patterning of the first resist layer or of the second resist layer or of the first and second resist layers includes arranging an exposure dose in accordance with the ratio to provide the target duty cycle.

19. The method according to claim 12, further comprising splitting the desired pattern into two interposed target patterns, respectively the first target pattern and the second target pattern.

20. The method according to claim 1, wherein the periodic arrangement of the target pattern has a target pitch, the periodic arrangement of the patterning device pattern has an object pitch, a target duty cycle, defined as the target feature width divided by the target pitch, is 0.5+/−0.05 and an object duty cycle, defined as the object feature width divided by the object pitch, is 0.25+/−0.05.

21. The method according to claim 1, wherein the resist is a positive tone resist.

22. The method according to claim 1, wherein the target feature is a line shaped feature.

23. The method according to claim 1, wherein the compensating includes arranging an exposure dose in accordance with the ratio.

24. The method according to claim 23, wherein the compensating includes developing exposed resist and applying a feature shrink process.

25. The method according to claim 1, wherein the target feature is a resist material feature and the adjacent space to the target feature is a photo-activated portion of resist material.

* * * * *